United States Patent

Eaton et al.

[11] Patent Number: 6,140,837
[45] Date of Patent: Oct. 31, 2000

[54] CHARGE PUMPS OF ANTIFUSE PROGRAMMING CIRCUITRY POWERED FROM HIGH VOLTAGE COMPATIBILITY TERMINAL

[75] Inventors: David D. Eaton, San Jose; Richard J. Wong, Saratoga; James M. Apland, Gilroy, all of Calif.

[73] Assignee: QuickLogic Corporation, Sunnyvale, Calif.

[21] Appl. No.: 09/161,192

[22] Filed: Sep. 25, 1998

Related U.S. Application Data

[63] Continuation-in-part of application No. 09/112,700, Jul. 8, 1998, which is a continuation-in-part of application No. 09/076,367, May 11, 1998.

[51] Int. Cl.[7] .................. H03K 19/173; H03K 19/175; G05F 1/10
[52] U.S. Cl. .................. 326/38; 326/37; 326/38; 326/39; 326/40; 326/41; 326/80; 326/81; 326/83; 326/86; 326/88; 327/536; 327/537
[58] Field of Search .................. 326/37, 38, 39, 326/40, 41, 80, 81, 83, 86, 88; 327/536, 537

[56] References Cited

U.S. PATENT DOCUMENTS

| | | |
|---|---|---|
| 4,873,459 | 10/1989 | El Gamal et al. . |
| 5,122,685 | 6/1992 | Chan et al. . |
| 5,235,221 | 8/1993 | Douglas et al. .................. 307/465 |
| 5,327,024 | 7/1994 | Cox . |
| 5,341,030 | 8/1994 | Galbraith . |
| 5,349,248 | 9/1994 | Parlour et al. .................. 307/465 |
| 5,362,676 | 11/1994 | Gordon et al. . |
| 5,367,207 | 11/1994 | Goetting et al. .................. 307/465 |
| 5,424,655 | 6/1995 | Chua . |
| 5,495,181 | 2/1996 | Kolze . |

(List continued on next page.)

OTHER PUBLICATIONS

QuickLogic 1996/97 Data Book, pp. i through vi, 1–5 through 1–16, 2–1 through 2–11, 2–13 through 2–18,3–1 through 3–14, 3–15 through 3–23, 6–33 through 6–36 (1996/97).

Actel 1996 FPGA Data Book And Design Guide, pp. 4–1 through 4–7, 4–95 through 4–100, 4–115 through 4–121, 4–113 through 4–144, 4–151 through 4–215, 7–1 through 7–8 (Apr. 1996).

Actel 1998 54SX Family FPGA Preliminary v1.0 Data Sheet, pp. 1–35 (Mar. 1998).

*Primary Examiner*—Michael Tokar
*Assistant Examiner*—Vibol Tan
*Attorney, Agent, or Firm*—Skjerven Morrill MacPherson LLP

[57] ABSTRACT

A programmable device has digital logic elements and a programmable interconnect structure employing antifuses, the antifuses being programmable to connect selected ones of the digital logic elements together. During normal circuit operation, a first power input terminal is used to power the digital logic elements with a first supply voltage received on the first power input terminal. During normal circuit operation, a second power input terminal is used to protect circuitry of the programmable device from high voltage signals that may be driven onto terminals of the programmable device by circuitry external to the programmable device. During antifuse programming, the second power input terminal is used to drive charge pumps of programming drivers and/or programming control drivers. In some embodiments, the second power input terminal receives a voltage higher than the first supply voltage during antifuse programming such that the oscillating signal that drives the charge pumps has a larger amplitude thereby allowing back bias threshold voltages of transistors in the charge pumps to be overcome, facilitating starting of the charge pumps, and/or increasing charge pump efficiency.

14 Claims, 11 Drawing Sheets

U.S. PATENT DOCUMENTS

| | | |
|---|---|---|
| 5,502,315 | 3/1996 | Chua et al. . |
| 5,534,793 | 7/1996 | Nasserbakht . |
| 5,534,798 | 7/1996 | Phillips et al. . |
| 5,537,056 | 7/1996 | McCollum . |
| 5,544,070 | 8/1996 | Cox et al. . |
| 5,557,136 | 9/1996 | Gordon et al. . |
| 5,574,634 | 11/1996 | Parlour et al. . |
| 5,600,262 | 2/1997 | Kolze ......... 326/38 |
| 5,656,949 | 8/1997 | Yip et al. ......... 326/38 |
| 5,661,412 | 8/1997 | Chawla et al. . |
| 5,682,106 | 10/1997 | Cox et al. ......... 326/39 |
| 5,687,116 | 11/1997 | Kowshik et al. ......... 365/185.03 |
| 5,701,027 | 12/1997 | Gordon et al. . |
| 5,790,448 | 8/1998 | Merritt et al. ......... 365/96 |
| 5,811,336 | 9/1998 | Kasai ......... 438/271 |
| 5,945,840 | 8/1999 | Cowles et al. ......... 326/38 |
| 6,028,444 | 2/2000 | Wong et al. ......... 326/38 |

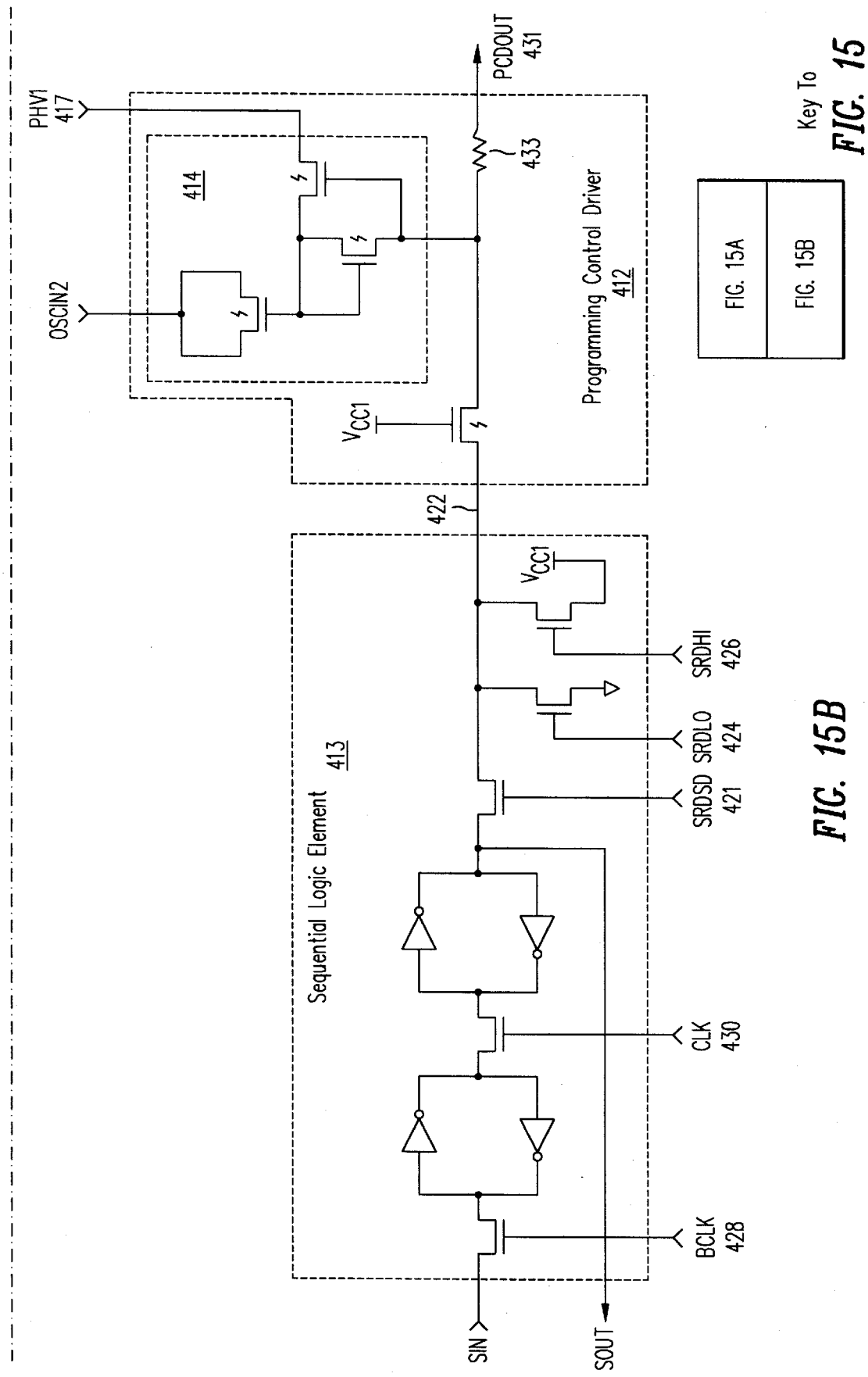

CHARGE PUMPS OF ANTIFUSE PROGRAMMING CIRCUITRY POWERED FROM HIGH VOLTAGE COMPATIBILITY TERMINAL

CROSS-REFERENCE TO RELATED APPLICATIONS

This application is a continuation-in-part of U.S. patent application Ser. No. 09/112,700, filed Jul. 8, 1998, which is a continuation-in-part of U.S. patent application Ser. No. 09/076,367, filed May 11, 1998.

BACKGROUND INFORMATION

A field programmable gate array is a versatile integrated circuit chip, the internal circuitry of which may be configured by an individual user to realize a user-specific circuit. To configure a field programmable gate array, the user configures an on-chip interconnect structure of the field programmable gate array so that selected inputs and selected outputs of selected on-chip logic components are connected together in such a way that the resulting circuit is the user-specific circuit desired by the user. For additional background on antifuse-based field programmable gate array structures, the reader is referred to: U.S. Pat. Nos. 5,495,181, 5,424,655, 5,122,685, 5,327,024, 5,055,718, 4,873,459; U.S. patent application Ser. No. 08/667,783 entitled "Interface Cell For A Programmable Integrated Circuit Employing Antifuses," filed Jun. 21, 1996 by Paige A. Kolze et al. now U.S. Pat. No. 5,900,742, issued May 4, 1999; the 1994 QuickLogic Data Book; the 1996 Actel FPGA Data Book and Design Guide; and the book entitled "Field-Programmable Gate Arrays" by Stephen Brown et al., Kluwer Academic Publishers (1992) (the subject matter of these documents is incorporated herein by reference).

FIG. 1 ( Prior Art) is a top down diagram of a field programmable gate array (FPGA) 1 including a logic array 2, programming control circuits 3, output drivers 4 and output terminals 5, a supply voltage power input terminal (VCC) 6, a ground terminal (GND) 7, and a high voltage compatibility power input terminal (HVC) 8. Logic array 2 includes a plurality of logic modules 9 arranged in rows and columns as well as a programmable interconnect structure 10 employing antifuses disposed in the spaces between the logic modules. Antifuses in the interconnect structure are programmed by putting the FPGA into a programming mode and then loading programming data serially from a terminal (not shown) of the FPGA into the programming control circuits 3. The programming control circuits 3 cause a programming voltage Vpp (for example, 10.5 volts) received on a programming voltage terminal VPP (not shown) of the FPGA to be imposed across a selected antifuse in the interconnect structure such that the antifuse "programs" to form a permanent low resistance connection between two signal conductors of the interconnect structure. The antifuses to be programmed to realize the user-specific circuit are programmed under the control of the programming control circuits. For additional background on the structure of the programming control circuits and associated programming structures and methods, the reader is referred to: U.S. patent application Ser. No. 08/677,702 entitled "Programming Architecture For A Programmable Integrated Circuit Employing Antifuses", filed Jun. 21, 1996 by Paige A. Kolze, now U.S. Pat. No. 5,825,201, issued Oct. 20, 1998. (the subject matter of which is incorporated herein by reference).

FIG. 2 (Prior Art) is a simplified diagram of parts of two logic modules 11 and 12 of FPGA 1. The output node 13 of the output device 14 of logic module 11 is coupled to input lead 15 of an input logic device 16 of logic module 12 via high voltage output protection transistors 17 and 18, horizontally extending signal conductor 19, programmed cross antifuse 20, vertically extending signal conductor 21, programmed cross antifuse 22, horizontally extending signal conductor 23, programmed cross antifuse 24, vertically extending signal conductor 25, programmed cross antifuse 26, and horizontally extending signal conductor 27. This particular path through the interconnect structure is chosen for explanatory purposes. Input logic device 16 drives a select input of a three multiplexer structure such as disclosed in FIG. 3E of U.S. Pat. No. 5,424,655 (the subject matter of which is incorporated herein by reference).

During antifuse programming, a programming voltage (for example, 10.5 volts) may be present on various of the signal conductors of the interconnect structure. For example, a 10.5 volt programming voltage may be placed on horizontal signal conductor 19 while vertical signal conductor 21 is grounded such that the 10.5 programming voltage appears across cross antifuse 20 such that antifuse 20 is programmed. Without high voltage output protection transistors 17 and 18 isolating the high programming voltage from the low voltage logic transistors 28 and 29 of the output device 14, the low voltage logic transistors 28 and 29 could be damaged.

FIG. 3 illustrates one way such damage could occur. To impose the 10.5 volt programming voltage across cross antifuse 20, a 10.5 volt programming voltage is placed on horizontal signal conductor 19. FIG. 4 is a cross-sectional diagram of the low voltage P-channel pull-up transistor 28 of the output device 14 of logic module 11. Because the low voltage logic transistors 28 and 29 of the output device of the logic module are powered by a lower supply voltage (in this case 3.3 volts) and the N well 29A (transistor body) of the P-channel pull-up transistor 28 is coupled via contact 30 to the source region 31, the N well 29A is coupled to 3.3 volts and the P+ drain region 32A to N well 29A boundary is forward biased. To avoid this potentially harmful situation as well as other problems, the high voltage output protection transistors 17 and 18 are provided. The high voltage output protection transistors 17 and 18 are nonconductive during antifuse programming, thereby protecting the low voltage logic transistors 28 and 29 from damage. During normal circuit operation of the FPGA, the high voltage output protection transistors 17 and 18 are made conductive, thereby connecting the output node 13 of the output device 14 to the horizontally extending signal conductor 19. If only high voltage output protection transistor 17 were provided, then a digital logic high signal passing from output node 13 to horizontal signal conductor 19 would suffer a threshold drop due to the fact that the gate of transistor 17 is biased at supply voltage VCC. Another high voltage output protection transistor 18 whose gate is driven with a voltage that is greater that VCC is therefore provided. This higher charge pump voltage (VCP) is needed during normal circuit operation and is provided by an on-chip charge pump (not shown). The charge pump consumes space on the integrated circuit and consumes approximately 500 microamperes maximum of standby current (over the 0–70 degrees Celsius range) even if the other digital logic of the FPGA is sitting idle and not switching. This standby current drain is highly undesirable for low power and battery applications.

If the low voltage logic transistors 28 and 29 did not need to be protected from the high voltage on the signal conductors during programming, then two high voltage output protection transistors could be omitted from each logic module output. This would make the logic module smaller. Moreover, the charge pump could be omitted. This reduces the standby current consumption of the FPGA.

During power up of the FPGA, the supply voltage VCC and the charge pump voltage VCP supplied to the high voltage output protection transistors 17 and 18 will be at intermediate voltages for some period of time. These protection transistors 17 and 18 will therefore not be fully conductive and the output devices of the logic modules will not be fully coupled to the signal conductors of the interconnect structure. As a result, intermediate voltages may be present on the signal conductors of the interconnect structure and on the input leads of the logic module input devices. These intermediate voltages may cause an undesirable power current spike during power up through logic module input devices.

FIG. 5 (Prior Art) is a transistor level diagram of the NAND gate logic module input device 16. Input device 16 has three non-inverting input leads 32–34 and four inverting input leads 35, 15, 36 and 37. Transistors 38–45 form a four input NOR gate and transistors 46–53 form a four input NAND gate. If all the input leads 35, 15, 36 and 37 were, for example, floating and at intermediate voltage levels, all of P-channel transistors 38–41 would be partially conductive and all of N-channel transistors 42–45 would be partially conductive. Accordingly, a current would flow from supply voltage VCC at the source of transistor 38 (for example, 3.3 volts) through transistors 38–45 to ground at the sources of transistors 42–45.

To prevent this situation, one of the input leads 37 is coupled to a hard wired internal disable signal (INTDIS). This INTDIS signal is initially high (substantially equal to VCC as VCC rises) during the power up period when the intermediate voltages may be present on the input device 16 input leads. For additional information on internal disable circuitry, see U.S. patent application Ser. No. 08/775,984 entitled "Power-Up Circuit For Field Programmable Gate Array," filed Jan. 3, 1997 by James M. Apland et al., now U.S. Pat. No. 5,828,538, issued Oct. 27, 1998. (the subject matter of which is incorporated herein by reference). Providing this extra INTDIS signal adds two additional transistors 41 and 42 to each such logic module input device as well as the associated interconnect to connect all the logic module input devices to an INTDIS signal conductor. If the INTDIS signal were not needed, then transistors 41 and 42 could be omitted resulting in considerable die area savings.

Although the internal circuitry of FPGA 1 operates with a power supply voltage VCC (for example, 3.3 volts), the FPGA may be placed on a printed circuit board with other logic that has a higher power supply voltage. This other logic may therefore drive a digital logic high signal of, for example, 5.0 volts onto terminals of the FPGA. It is desired that the FPGA be able to receive such high voltage logic signals without failing, being damaged, or sinking too much current.

FIG. 6 (Prior Art) is a simplified diagram illustrating the output driver 4 including a P-channel pull-up transistor 54 and an N-channel pull-down transistor 55 as well as output terminal 5. Consider the situation where logic external to the FPGA drives a digital logic high of 5.0 volts onto output terminal 5, the output driver is powered with a lower supply voltage (for example, 3.3 volts), and the semiconductor body into which the P-channel pull-up transistor 54 is formed is biased at 3.3 volts. FIG. 7 is a cross-sectional diagram illustrating P-channel pull-up transistor 54 in this situation. The P+ drain region 56 to N well 57 boundary will be forward biased giving rise to a possible large flow of current 58 into output driver 4. Such a forward bias situation could damage the FPGA and/or clamp the voltage to which the external logic can drive terminal 5 for a digital logic level high.

High voltage compatibility power input terminal (HVC) 8 is therefore provided. If external logic is to be able to drive terminal 5 to a 5.0 volt digital logic high level, for example, then HVC terminal 8 is coupled to a 5.0 volt supply and the HVC terminal is coupled to the semiconductor body (N well 57) of the P-channel pull-up transistor 54 of the output driver 4. With N well 57 biased to 5.0 volts, the P+ drain to N well boundary is not forward biased when the external logic attempts to drive terminal 5 to 5.0 volts.

FIGS. 1, 6 and 7 illustrate output driver 4 in simplified form to clarify the explanation. FIG. 8 (Prior Art) is a circuit diagram of an actual output driver circuit. The output driver circuit includes a non-inverting input lead 59, an enable input lead 60 and an output lead 61. The semiconductor body of P-channel pull-up transistor 54 is coupled to the high voltage compatible input power terminal HVC 8 whereas its source is coupled to supply voltage power input terminal VCC 6. The circuitry 62 in the dashed box is a level shifting circuit.

SUMMARY

To protect the low voltage transistors of the output drivers of logic modules from high voltages and/or to enable proper antifuse programming, the logic modules are not powered during antifuse programming. In some embodiments, two separate power input terminals VCC1 and VCC2 are provided, power input terminal VCC1 being coupled to power the logic modules and power input terminal VCC2 being coupled to power the programming control circuitry. Power terminal VCC1 is left floating or is grounded during antifuse programming such that the logic modules are not powered but such that the programming circuitry is powered during antifuse programming via the second power terminal VCC2. Logic module output protection transistors are not required nor is the associated charge pump. Because the logic module input devices are not powered, a current surge through the input devices on power up does not occur and an internal disable signal INTDIS and associated circuitry is not required. In one embodiment, the field programmable gate array is made smaller because it has no internal disable signal and associated circuitry, no logic module output protection transistors, and no charge pump that operates during normal circuit operation. In another embodiment, the field programmable gate array is made smaller because it has no internal disable signal and associated circuitry and has smaller logic module input transistors. In some embodiments, power input terminal VCC2 is a high voltage compatible power input terminal.

In accordance with another embodiment, a programmable device employing antifuses has first digital logic transistors and second digital logic transistors. The gate electrodes of the first digital logic transistors will experience a high voltage (such as programming voltage Vpp) during antifuse programming whereas the gates of the second digital logic transistors will not. To prevent the first digital logic transistors from being damaged without unduly increasing the size of the second digital logic transistors, the first digital logic transistors are made to have a greater gate insulator thickness than the second digital logic transistors. In some embodiments, the first digital logic transistors are transistors of digital logic elements, the gates of which carry the programming voltage Vpp during antifuses programming. In some embodiments, the first digital logic transistors are logic module input transistors. In other embodiments, the first digital logic transistors are transistors coupled to an enable input lead where the enable input lead is couplable to a tie-high conductor or to a tie-low conductor depending on which of two antifuses is programmed.

In some embodiments, a high voltage compatibility input terminal is used to drive charge pumps of programming drivers and/or programming control drivers during antifuse programming. Use of the high voltage compatibility input terminal for this purpose allows a relatively high supply voltage to be supplied to an oscillator circuit so that the oscillator circuit will drive the charge pumps with a higher amplitude oscillating drive signal. The higher amplitude oscillating drive signal may promote start up of the charge pumps, increase charge pump efficiency and/or allow back bias threshold voltages of transistors in the charge pumps to be overcome. During normal circuit operation, the high voltage compatibility input terminal is used to protect the programmable device from high voltage signals driven onto the programmable device by circuitry external to the programmable device.

Other embodiments and methods are described in the detailed description section below. This summary does not purport to define the invention. The invention is defined by the claims.

BRIEF DESCRIPTION OF THE DRAWINGS

FIG. 15, comprising FIGS. 15A and 15B, is a simplified circuit diagram in accordance with another embodiment wherein a high voltage compatibility input terminal is used to drive charge pumps of programming drivers and/or programming control drivers during antifuse programming and that same high voltage compatibility input terminal is used during normal circuit operation to protect the programmable device from high voltage signals driven onto the programmable device by external circuitry.

DETAILED DESCRIPTION OF THE PREFERRED EMBODIMENTS

Figure 9:
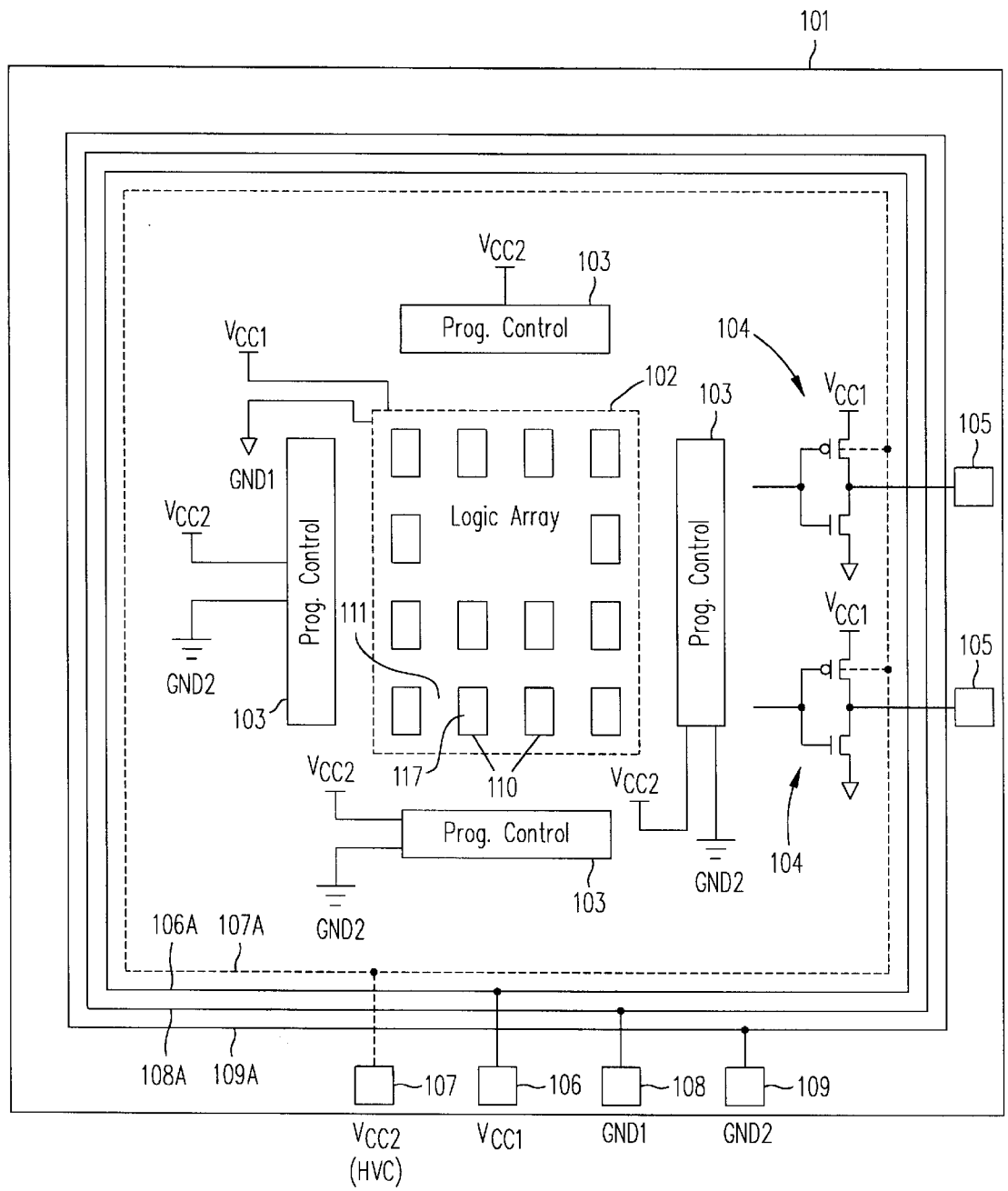
FIG. 9 is a simplified top-down diagram of an antifuse-based field programmable gate array in accordance with an embodiment of the present invention.

FIG. 9 is a simplified top-down diagram of a field programmable gate array (FPGA) 101 in accordance with an embodiment of the present invention. FPGA 101 includes a logic array 102, programming control circuits 103, output drivers 104 and output terminals 105, a first supply voltage power input terminal (VCC1) 106, a second supply voltage power input terminal (VCC2) 107, a first ground terminal (GND1) 108, a second ground terminal (GND2) 109. Logic array 102 includes a plurality of logic modules 110 arranged in rows and columns as well as a programmable interconnect structure 111 employing antifuses disposed in the spaces between the logic modules.

First supply voltage power input terminal (VCC1) 106 is coupled to the logic array 102 to supply power to the logic array 102. Second supply voltage power input terminal (VCC2) 107 is coupled to the program control circuits 103 to supply power to the program control circuits 103. First supply voltage power input terminal (VCC1) is electrically isolated from the second supply voltage power input terminal (VCC2) such that programming control circuits can be powered during antifuse programming via the second supply voltage power input terminal (VCC2) when the digital logic of the logic modules of the logic array 102 is left unpowered.

Figure 10:
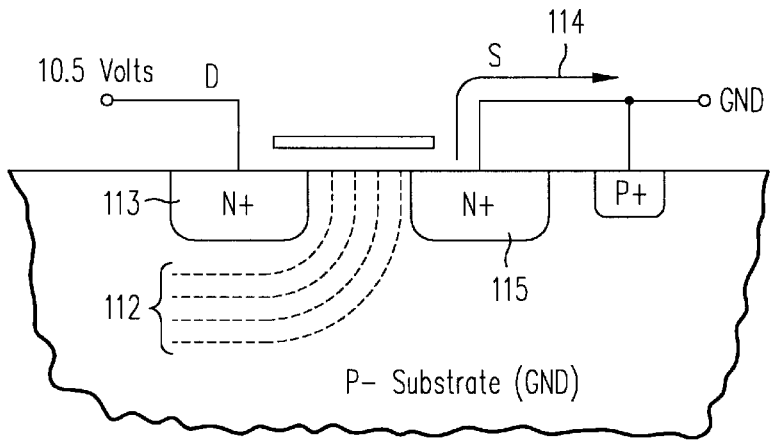
FIG. 10 is a simplified diagram illustrating a potential problem associated with logic module output devices.

FIG. 10 is a cross-sectional diagram illustrating a potential problem when the sources of the N-channel pull-down transistors of the logic module output devices are coupled to ground potential during antifuse programming. Because the drain of the logic module output device may be driven with the programming voltage (for example, 10.5 volts) during antifuse programming, the depletion region 112 around the drain region 113 to where drain-to-source punch through occurs. A punch through current 114 may flow from source region 115.

Figure 11:
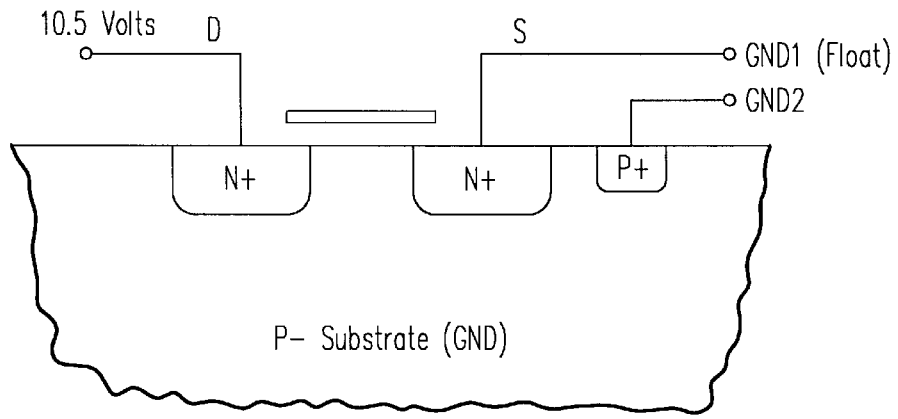
FIG. 11 is a simplified diagram illustrating a solution to the potential problem illustrated in FIG. 10.

FIG. 11 is a simplified diagram illustrating a solution to the problem illustrated in FIG. 10 whereby the punch through current path is broken by the use of two electrically isolated ground terminals. First ground terminal (GND1) 108 is coupled to ground the digital logic of the logic modules of logic array 102. Terminal GND1 may be coupled to the sources of the N-channel pull-down transistors of the logic module output devices circuitry as illustrated in FIG. 11.

Second ground terminal (GND2) 109 is coupled to ground the digital logic of the programming control circuits 103 and to the substrate of the entire integrated circuit 101 (substrate for the logic array 102 as illustrated in FIG. 11, substrate for the programming control circuits 103, and substrate for the output drivers 104). Terminal GND2 may be coupled to the sources of the N-channel pull-down transistors of the digital logic circuitry of the programming control circuits 103. First ground terminal GND1 is electrically isolated from the second ground terminal GND2 such that logic array ground can be left floating by leaving first ground terminal GND1 floating during antifuse programming when the programming control circuitry ground is grounded via second ground terminal (GND2).

In the embodiment of FIG. 9, there are four power busses running around the periphery of integrated circuit 101. One power bus 106A is coupled to first power input terminal VCC1 106, another power bus 107A is coupled to second power input terminal VCC2 107, another power bus 108A is coupled to first ground terminal GND1 108, and another power bus 109A is coupled to second ground terminal GND2 109. These four power busses form part of the power grid of the integrated circuit 101. There are numerous power conductors (now shown) extending from these peripheral busses to locations requiring such voltages in the interior of the integrated circuit. In one specific embodiment, there are ten VCC1 terminals, two VCC2 terminals, eight GND1 terminals, and two GND2 terminals.

Figure 3:
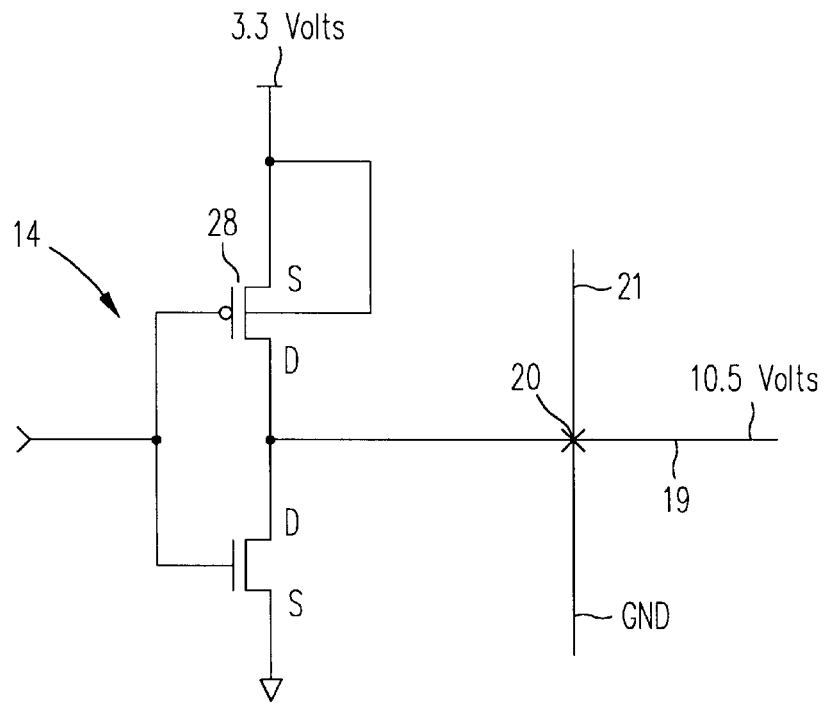
FIG. 3 is a simplified diagram illustrating a problem associated with programming an antifuse in the conventional FPGA of FIG. 1 if high voltage logic module output protection transistors are not provided.
Figure 4:
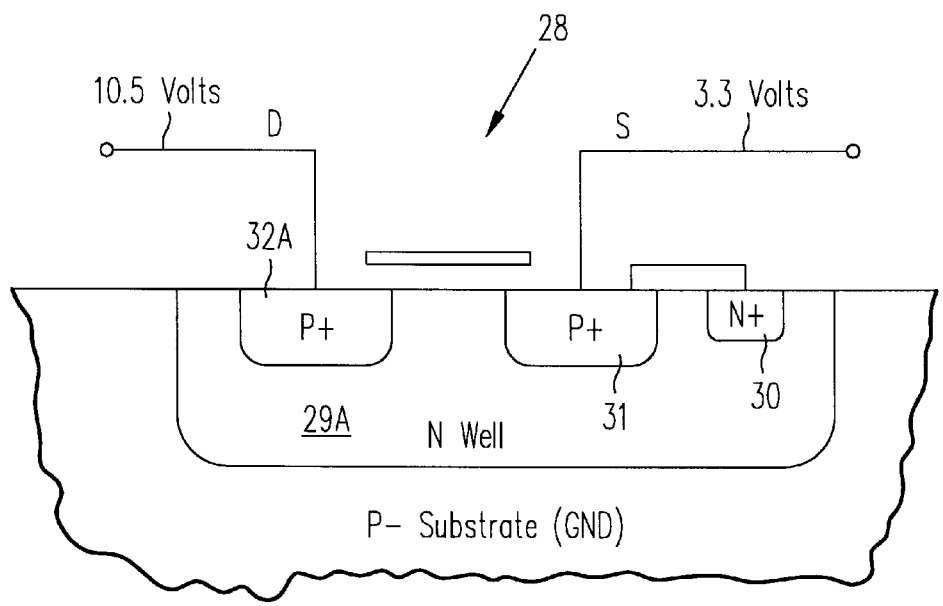
FIG. 4 is a cross-sectional diagram of the P-channel pull-up transistor of FIG. 3.
Figure 5:
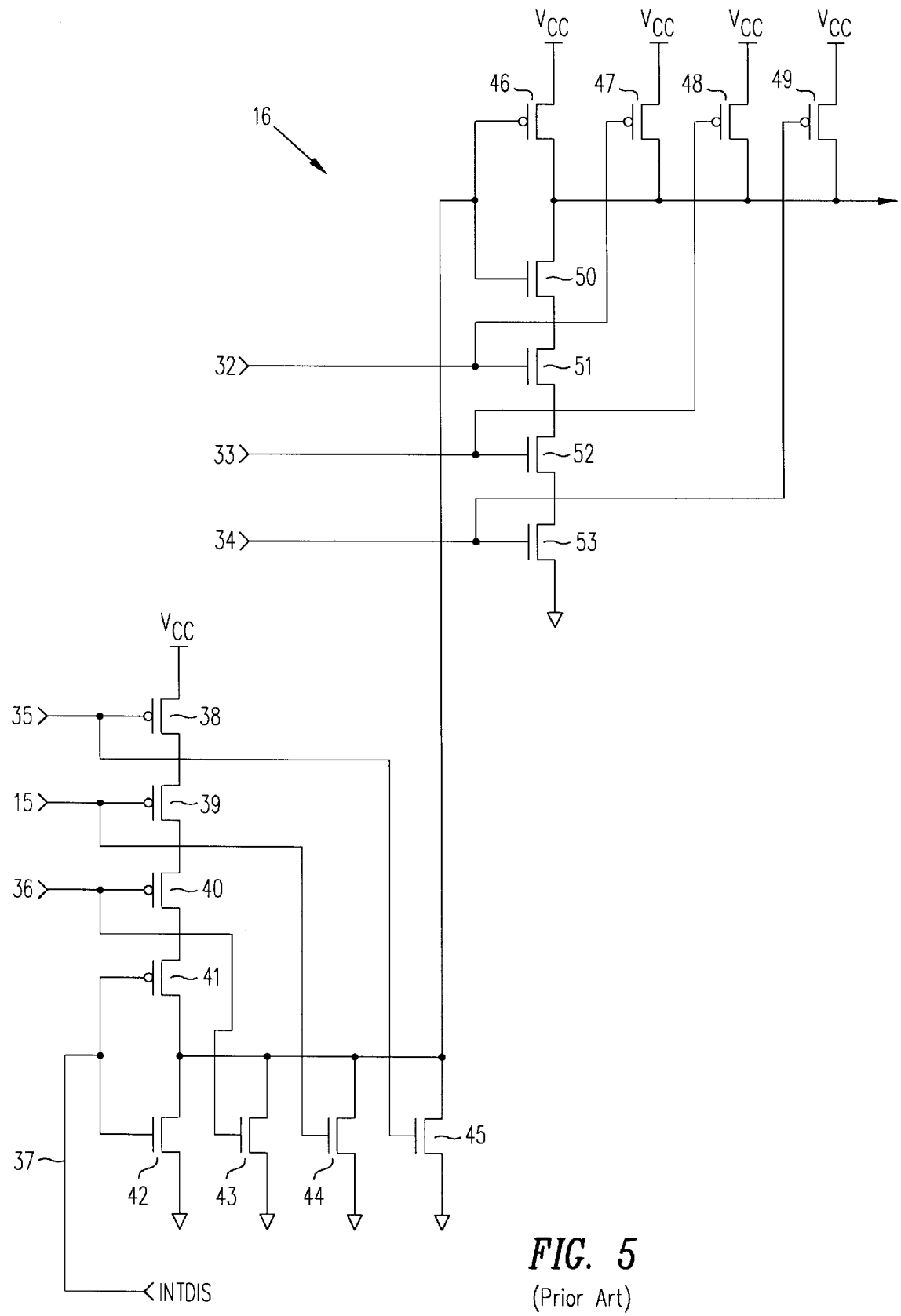
FIG. 5 (Prior Art) is a transistor level diagram of a logic module input device of FIG. 2.
Figure 12:
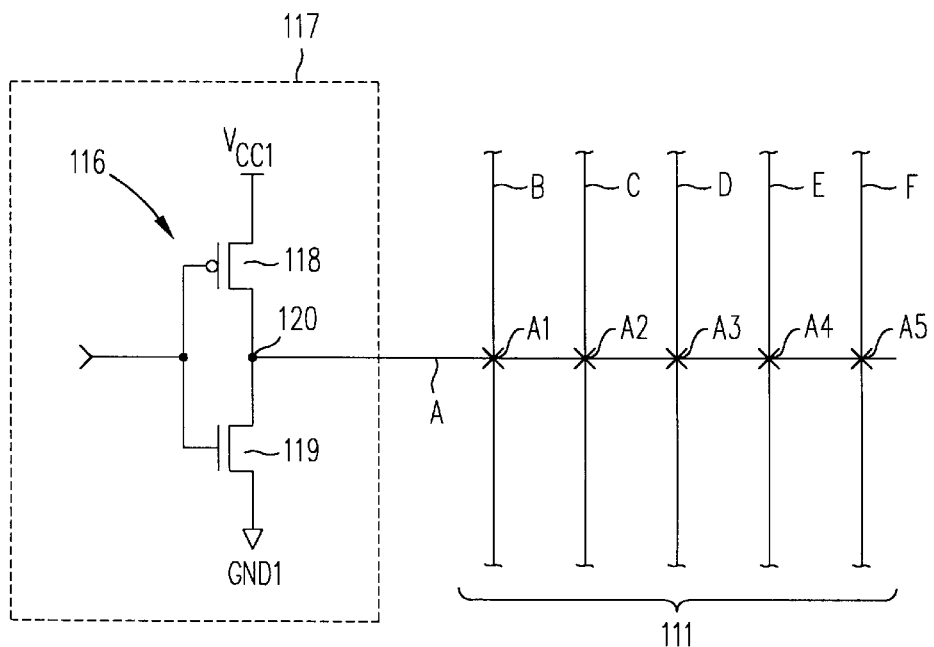
FIG. 12 is a transistor level diagram of a logic module output device and the signal conductor it drives.

FIG. 12 is a diagram of an output device 116 of logic module 117 of FIG. 9. Output device 116 includes a P-channel pull-up transistor 118 and an N-channel pull-down transistor 119. This output device 116 may, for example, be the output device driving the Q output of a flip-flop of logic module 117. The drain of transistor 118 is coupled to the drain of transistor 119 at logic module output node 120. Signal conductor A extends to the right from output node 120 into the interconnect structure 111 to cross vertical signal conductors B, C, D, E and F. Cross antifuses A1, A2, A3, A4 and A5 are disposed at locations where signal conductor A crosses signal conductors B, C, D, E and F, respectively. There is no transistor disposed in the signal path from output node 120 to antifuse A2, nor is there any transistor coupled to signal conductor A between output node 120 and antifuse A2. There also are no pass antifuses through which a signal passing from output node 120 to vertical conductor A2 must pass. Because there are no logic module output protection transistors, there is no charge pump on the integrated circuit that operates during normal circuit operation. Consequently the total standby current consumption during normal circuit operation can be made less than 250 microamperes maximum over the 0–70 degrees Celsius range, all of this current being due to leakage. The antifuses of FPGA 101 may be of any suitable type including amorphous silicon antifuses, oxide-nitride-oxide antifuses, antifuses where the dielectric through which a conductive filament forms is disposed in a via, and antifuses where the dielectric through which a conductive filament forms is disposed above a conductive plug. For antifuse structures see: U.S. Pat. No. 5,502,315, U.S. Pat. No. 5,362,676, and U.S. Pat. No. 5,557,136 (the subject matter of these patents is incorporated herein by reference). Any suitable logic module can be employed for logic module 117 including the logic module of FIG. 3E of U.S. Pat. No. 5,424,655 (the subject matter of which is incorporated herein by reference) and the logic module circuitry disclosed in the complete hierarchical schematic of the microfiche appendix of U.S. patent application Ser. No. 08/677,702 entitled "Programming Architecture For A Programmable Integrated Circuit Employing Antifuses" by Paige A. Kolze, filed Jun. 21, 1996 now U.S. Pat. No. 5,825,201, issued Oct. 20, 1998. (the subject matter of which is incorporated herein by reference).

EXAMPLE 1

The first supply voltage power input terminal (VCC1) and the first ground terminal (GND1) are left floating during antifuse programming while the programming control circuits 103 are powered via second supply voltage power input terminal (VCC2). Second ground terminal (GND2) is grounded during antifuse programming and during normal circuit operation.

Figure 6:
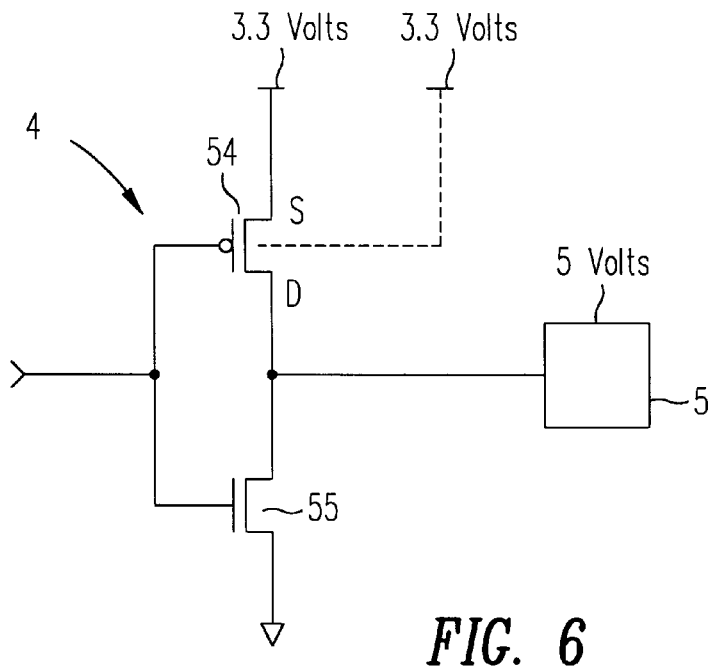
FIG. 6 (Prior Art) is a simplified diagram illustrating a high voltage compatibility problem associated with external logic driving high voltages onto FPGA terminals.
Figure 7:
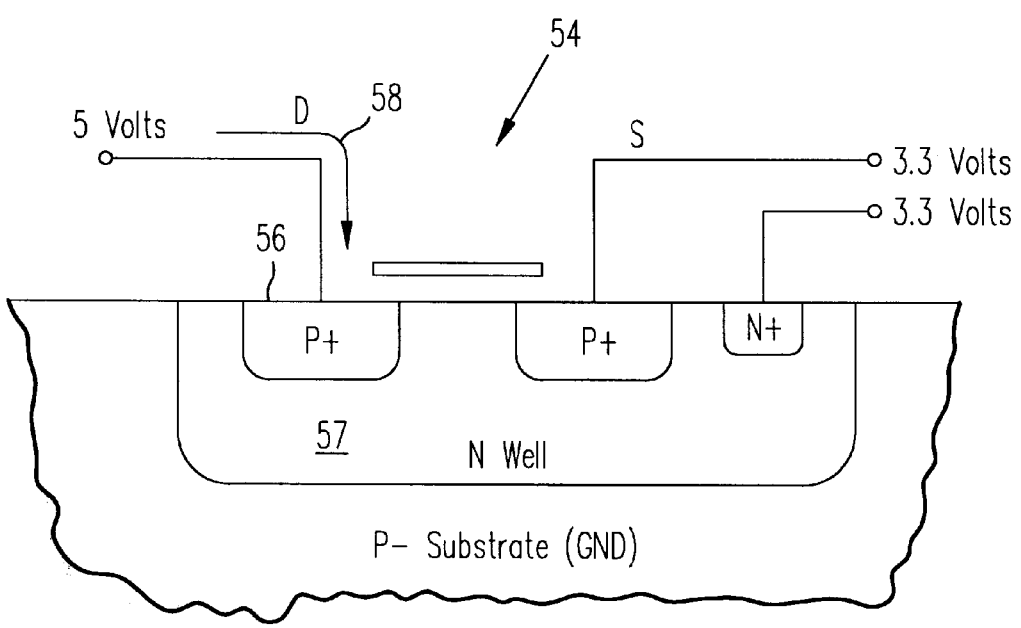
FIG. 7 is a cross-sectional diagram of a P-channel pull-up transistor in an output driver of FIG. 6.
Figure 8:
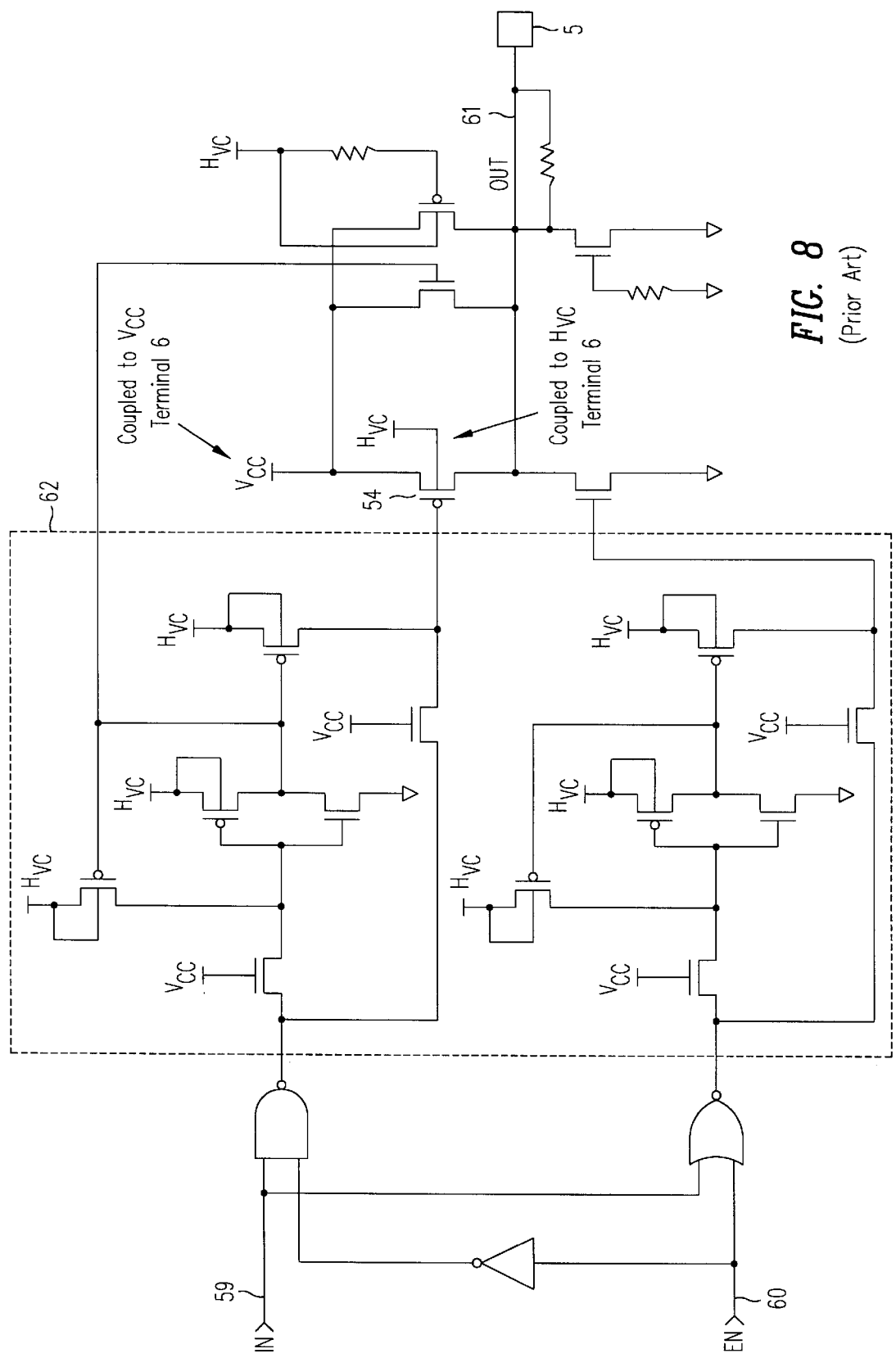
FIG. 8 (Prior Art) is a circuit diagram of an output driver of the FPGA of FIG. 1.

In some embodiments, the second supply voltage power input terminal (VCC2) 107 is a high voltage compatible (HVC) power input terminal. VCC2 terminal 107 may, for example, be coupled to the semiconductor body of the P-channel pull-up transistors of the output drivers 104 of the FPGA. In this way, VCC2 terminal 107 can be coupled to a high voltage (for example, 5.0 volts) to which external circuitry may drive terminals 105 such that the problem illustrated in FIGS. 6 and 7 does not occur. If, on the other hand, external circuitry will not be driving terminals of the FPGA to such a high digital logic high voltage, then VCC2 terminal 107 can be coupled to the supply voltage VCC (for example, 3.3 volts) during normal circuit operation.

EXAMPLE 2

The first supply voltage power input terminal (VCC1) and the first ground terminal (GND1) are both coupled to the same potential (such as both grounded or both coupled to supply voltage VCC) during antifuse programming. The programming control circuits 103, on the other hand, are powered via second supply voltage power input terminal (VCC2) during antifuse programming. Second ground terminal (GND2) is grounded during antifuse programming and during normal circuit operation.

EXAMPLE 3

Only one of the first supply voltage power input terminal (VCC1) and the first ground terminal (GND1) is floated during antifuse programming. If the first supply voltage power input terminal (VCC1) is floated, then the first ground terminal GND1 is grounded (for example, coupled to second ground terminal GND2). If the first ground terminal (GND1) is floated, then the first supply voltage power input terminal (VCC1) is coupled to supply voltage VCC (for example, 3.3 volts). The programming control circuits 103, on the other hand, are powered via second power supply voltage power input terminal (VCC2) during antifuse programming when the second ground terminal (GND2) is grounded.

EXAMPLE 4

The first supply voltage power input terminal (VCC1) and the first ground terminal (GND1) are both coupled during antifuse programming to the same potential that is greater than supply voltage VCC but is less than the programming voltage Vpp. The programming control circuits 103, on the other hand, are powered during antifuse programming via second power voltage supply input terminal (VCC2). Second ground terminal (GND2) is grounded during antifuse programming.

In example four, the field programmable gate array still requires output protection transistors but the internal disable signal is omitted and the two associated transistors in each of the many logic module input devices are also omitted. Removing the two transistors from each logic module input device results in considerable space savings because there are so very many logic module input devices on the field programmable gate array. In one embodiment, terminals VCC1 and GND1 are coupled to approximately 5.5 volts during antifuse programming (for an FPGA, the digital logic of which ordinarily operates from a 3.3 supply voltage and which receives a 10.5 volt programming voltage).

Moreover, the other input transistors of the logic module input devices can be made smaller because the maximum gate-to-source voltage that the logic module input device transistors experience is reduced. If the sources of the P-channel pull-up input transistors and the sources of the N-channel pull-down input transistors of the logic module input devices are floating as in example one at, for example, zero volts, then the programming voltage (for example, 10.5 volts) will be present between the gates and sources of these input transistors. The logic module input transistors could be made to have a thicker gate insulator so that they could withstand this large gate-to-source voltage, but such a thicker gate insulator would generally require a larger gate length and a larger gate width in order to maintain the same logic module input transistor performance. If however as in example four, the sources of the pull-up and pull-down input transistors of the logic module input devices are coupled together and tied to a potential greater than supply voltage VCC, then the largest gate-to-source voltage that will be present on the input transistors during antifuse programming will be smaller and the input transistors will not need to be made to withstand greater gate-to-source voltages. The many logic module input transistors can therefore be relatively small transistors that have the same gate insulator breakdown voltage as the other transistors of the digital logic in the logic modules. Because the gate insulator thicknesses of all the transistors in the logic modules are the same, the manufacturing process used to make the field programmable gate array has fewer processing steps.

Although example four is described above where the first supply voltage power input terminal (VCC1) and the first ground terminal (GND1) are both coupled to a potential greater than supply voltage VCC, the described advantages may also be realized by coupling terminals VCC1 and GND1 to a potential that is between supply voltage VCC and ground potential.

In the embodiment of FIG. 9, external circuitry is used to float the first power input terminal VCC1 106 and to power the second power input terminal VCC2 107 during antifuse programming. A programming board coupled to and controlled by a personal computer can serve this purpose. A particular programming board called DeskFab available from QuickLogic Corporation, 1277 Orleans Drive, Sunnyvale, Calif. 94089 (408)-990-4000 is suitable. Alternatively, circuitry can be provided on-chip to float logic array power during antifuse programming. In one exemplary embodiment, rather that providing a separate power input terminal VCC2 107, a field effect transistor is disposed in the VCC power supply line between power input terminal 106 and logic array 102. The gate of this transistor is coupled to the programming circuitry such that a signal indicative of being in the programming mode is supplied to the gate of the transistor and such that the transistor is nonconductive in the programming mode.

In some embodiments, the FPGA is tested once in a test mode during wafer sort and then once again in the test mode after packaging. If the FPGA passes these tests, it is then put into programming mode for configuration of the programmable interconnect. In test mode, the input leads of the logic module input devices are set up with data prior to the application of array power such that the power up current surge problem due to floating logic module input leads is not present. Special test antifuses are, however, programmed in the test mode in some embodiments. Accordingly, precautions in accordance with the present invention are taken to avoid damaging logic module output devices during the test mode. See the following U.S. patent applications (the subject matter of which is incorporated herein by reference) for further details on the test mode and associated circuitry and methods: 08/754,461 entitled "Security Antifuse That Prevents Readout Of Some But Not Other Information From A Programmed Field Programmable Gate Array" filed Nov. 21, 1996 by James M. Apland, et al., now U.S. Pat. No. 5,898,776, issued Apr. 27, 1999; and 08/677,702 entitled "Programming Architecture For A Programmable Integrated Circuit Employing Antifuses" filed Jun. 21, 1996 by Paige A., Kolze now U.S. Pat. No. 5,825,201, Oct. 20, 1998.

In accordance with some embodiments, a programmable device employing antifuses has first digital logic transistors and second digital logic transistors. The first digital logic transistors are digital logic transistors, the gates of which will experience a high voltage (such as programming voltage Vpp) during antifuse programming. The second digital logic transistors are digital logic transistors, the gates of which will not experience the high voltage. To prevent the first digital logic transistors from being damaged due to the presence of the programming voltage Vpp without unduly increasing the size of the second digital logic transistors, the first digital logic transistors are made to have a greater gate insulator thickness than the second digital logic transistors. In some embodiments, the gate insulator breakdown voltage of the second digital logic transistors is less than programming voltage Vpp whereas the gate insulator breakdown voltage of the first digital logic transistors is greater than programming voltage Vpp. By not increasing the gate insulator thickness of the second digital logic transistors, the gate length and gate width of the second digital logic transistors does not have to be increased to maintain the same general transistor performance as would generally be the case were the gate insulator thickness increased.

Figure 1:
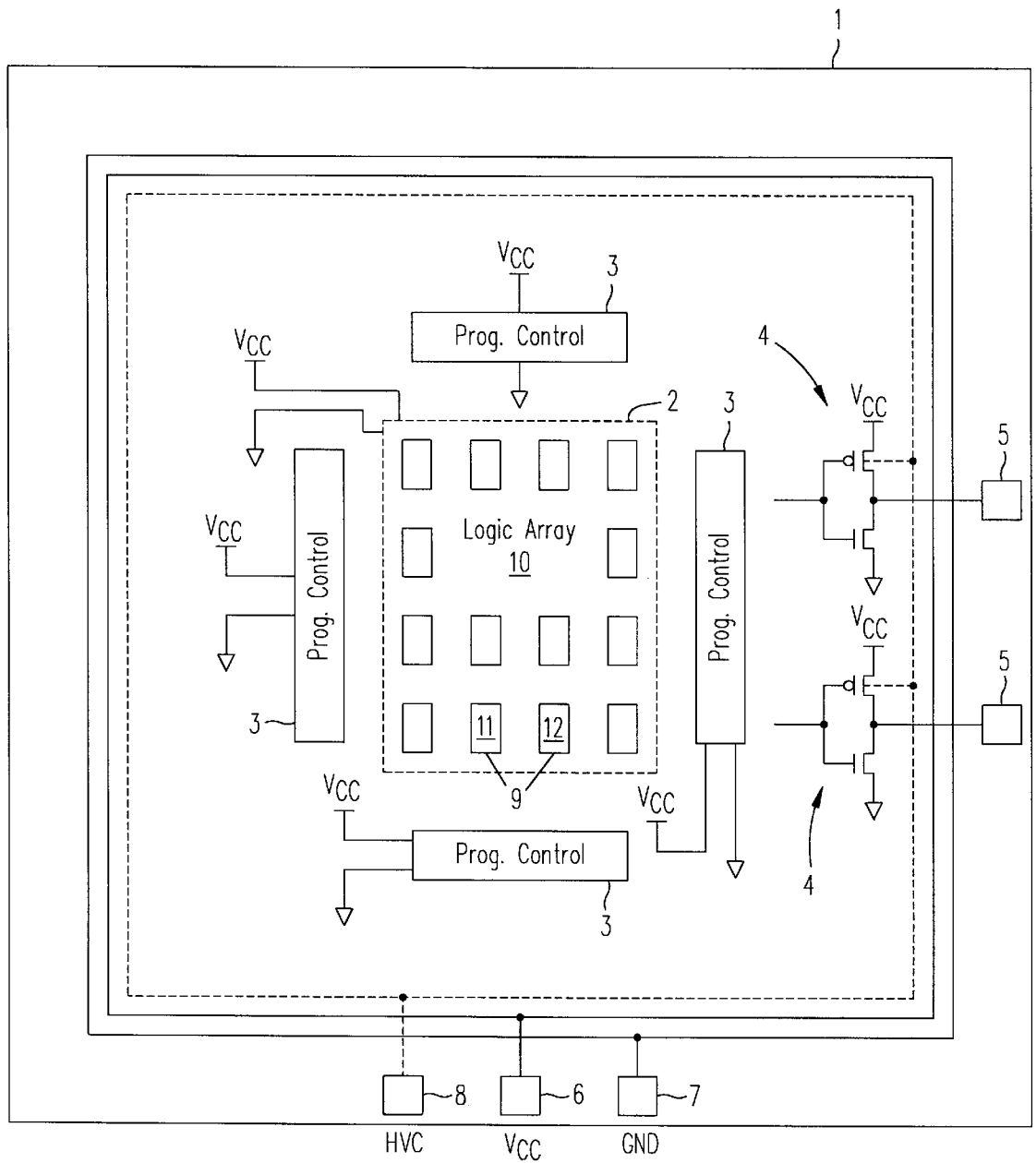
FIG. 1 (Prior Art) is a simplified top-down diagram of a conventional antifuse-based field programmable gate array (FPGA).
Figure 2:
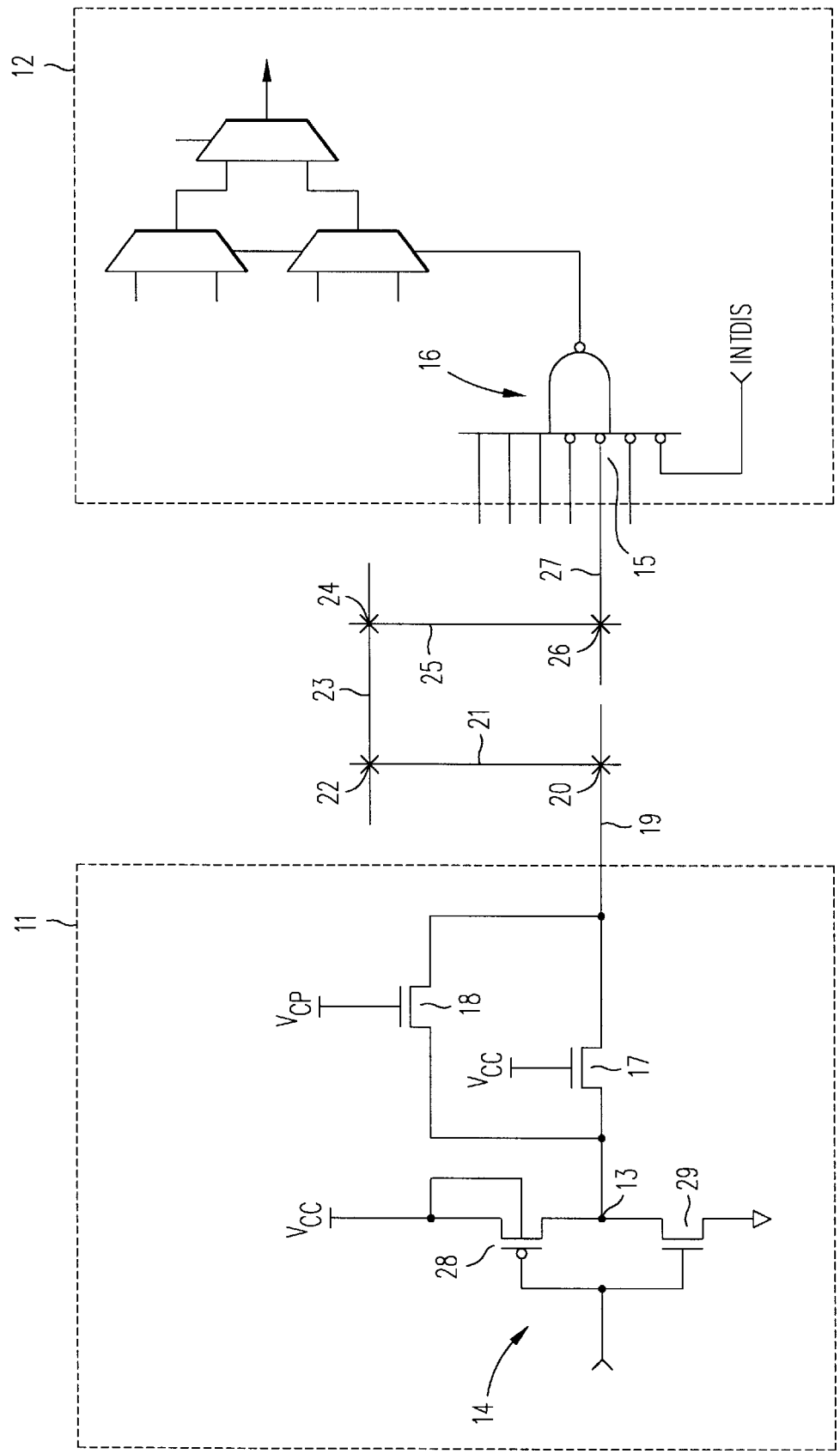
FIG. 2 (Prior Art) is a simplified diagram of parts of two logic modules of the conventional FPGA of FIG. 1.

In some embodiments, the first digital logic transistors are logic module input transistors and the second digital logic transistors are other digital logic transistors internal to the logic modules. In FIG. 2, the inversion bubbles on the bottom four inputs of NAND gate 16 may, for example, be realized using a four-input NOR gate. The output lead of this NOR gate is connected to one of four input leads of a four-input NAND gate. The transistors of the NOR gate would be logic module input transistors as would those transistors of the four-input NAND gate whose gate electrodes are directly connected to routing conductors that extend to the left out of the logic module. Other digital logic transistors of the logic module whose gate electrodes are not directly connected to routing conductors are second digital logic transistors. For additional specific details of one suitable logic module, see U.S. patent application Ser. No. 08/677,702, entitled "Programming Architecture For A Programmable Integrated Circuit Employing Antifuses", filed Jun. 21, 1996 by Paige A. Kolze, (the subject matter of which is incorporated herein by reference) and particularly the transistor level diagram of the logic module in the microfiche appendix.

In other embodiments, the first digital logic transistors are transistors coupled to an enable input lead where the enable input lead is programmably couplable to a tie-high conductor or to a tie-low conductor depending on which of two antifuses is programmed. Such enable inputs may, for example, be part of interface cells (input cells, output cells, or input/output cells) or of clock buffers.

Figure 13:
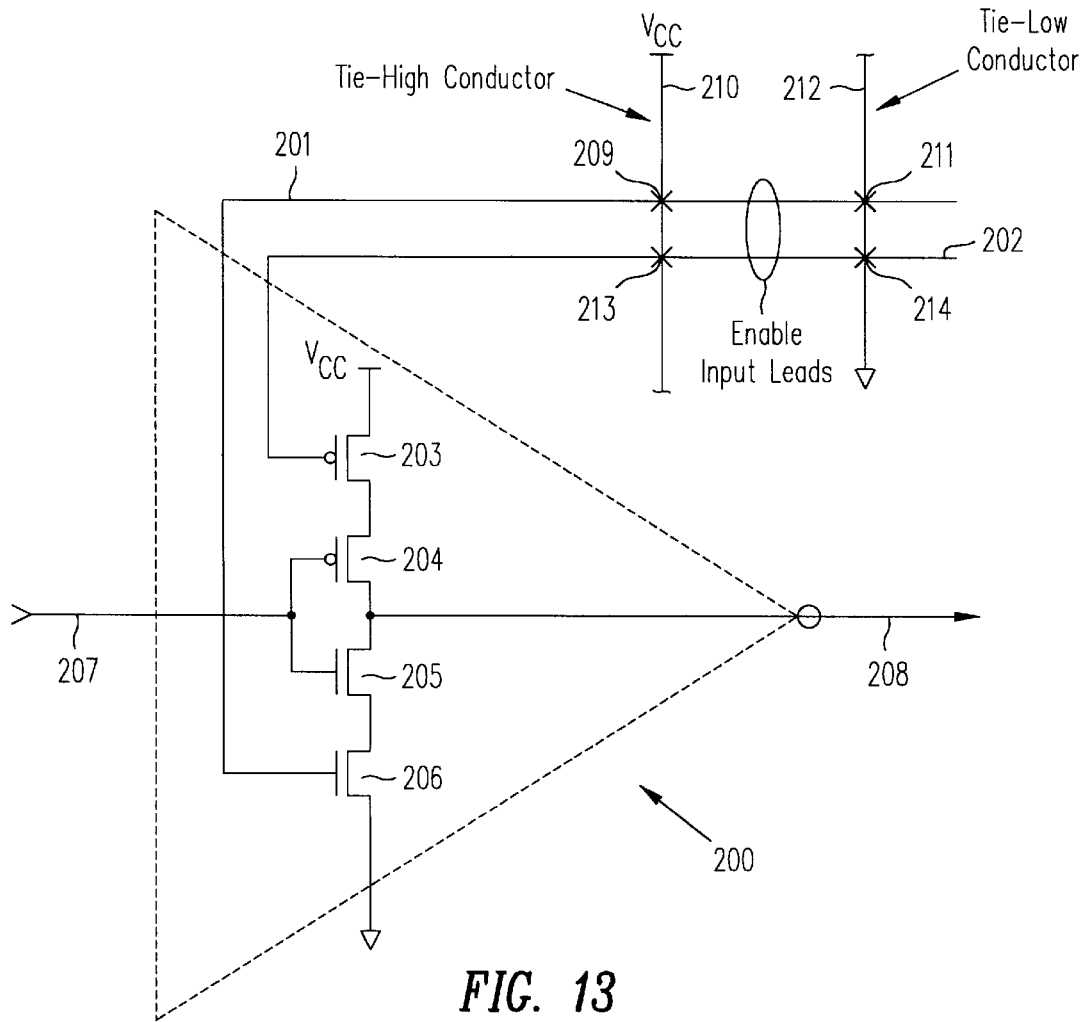
FIGS. 13 and 14 are transistor level diagrams of digital logic elements having some digital logic transistors with a first gate insulator thickness and other digital logic transistors with a second gate insulator thickness.

FIG. 13 is a transistor level diagram of a tristatable inverter buffer 200 with two enable input leads 201 and 202. It is to be understood that the particular inverter buffer of FIG. 13 is described here as an example for illustrative purposes and that other types of inverter buffer circuits can be employed. Inverter buffer 200 comprises two P-channel pull-up transistors 203 and 204, two N-channel pull-down transistors 205 and 206, a data input lead 207, a data output lead 208, and two horizontally extending enable input leads 201 and 202. Assume for discussion purposes that data input lead 207 and data output lead 208 are not directly coupled to routing conductors of the programmable interconnect structure and therefore will not carry programming voltage Vpp during antifuse programming.

A first antifuse 209 is disposed where a vertically extending tie-high conductor 210 crosses enable input lead 201. A second antifuse 211 is disposed where a vertically extending tie-low conductor 212 crosses enable input lead 201. Tie-high conductor 210 is permanently coupled to supply voltage Vcc whereas tie-low conductor 212 is permanently coupled to ground potential. A third antifuse 213 is disposed where tie-high conductor 210 crosses enable input lead 202. A fourth antifuse 214 is disposed where tie-low conductor 212 crosses enable input lead 202. To disable inverter buffer 200, antifuses 211 and 213 are programmed to render transistors 203 and 206 nonconductive. To enable inverter buffer 200, antifuses 209 and 214 are programmed to render transistors 203 and 206 conductive.

To program antifuses 209, 211, 213 and 214, it may be necessary to put programming voltage Vpp onto enable input leads 201 and 202. Consequently, digital logic input transistors 203 and 206 are made with a large gate insulator thicknesses sufficient to withstand the effects of having programming voltage Vpp on their gate electrodes. The other digital logic transistors of the inverter buffer 200 will not experience the programming voltage Vpp and therefore are made with a smaller gate insulator thickness. In some embodiments, the smaller gate insulator thickness results in a gate insulator breakdown voltage that is less than programming voltage Vpp, whereas the larger gate insulator thickness results in a gate insulator breakdown voltage that is larger than programming voltage Vpp. In some embodiments, all the digital logic transistors of the inverter buffer 200 are made to have the larger gate insulator thickness and it is the digital logic transistors internal to logic modules that are made to have the smaller gate insulator thickness.

Figure 14:
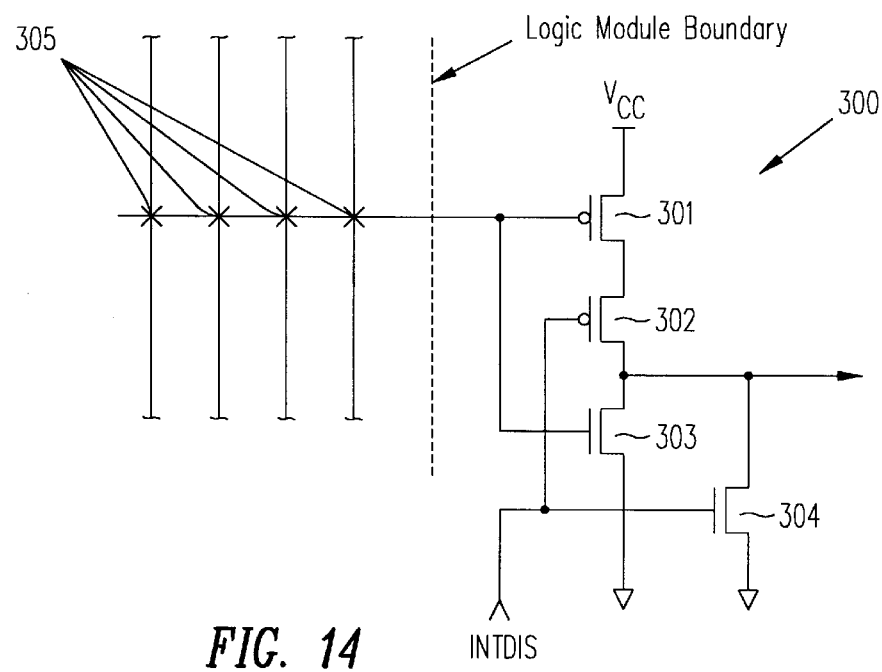

FIG. 14 is a transistor level diagram of another logic module input device 300. The logic module input device is a two-input NOR gate comprising four transistors 301, 302, 303 and 304. One of the input leads (a routing conductor) extends to the left out into the programmable interconnect to cross antifuses 305. During antifuse programming this input lead may be driven with programming voltage Vpp. Accordingly, logic module input transistors 301 and 303 are made to have a greater gate insulator thickness. The other input lead of NOR gate 300 is driven with a internal disable signal INTDIS, it is not a programmable routing conductor, and no antifuses are coupled to this input lead. Because the input lead labeled INTDIS will not experience the high programming voltage Vpp during antifuse programming, transistors 302 and 304 are made with a smaller gate insulator thickness.

The logic module boundary illustrated in FIG. 14 is for illustrative purposes and it is to be understood that antifuses 305 may be disposed in layers overlaying the logic module. In embodiments where the logic module input devices are protected by a thicker gate insulator thickness rather than by floating the power and/or ground supplies to logic module, logic module output transistors may be protected from the programming voltage Vpp by high voltage output protection transistors such as transistors 17 and 18 of FIG. 2.

Figure 15A:
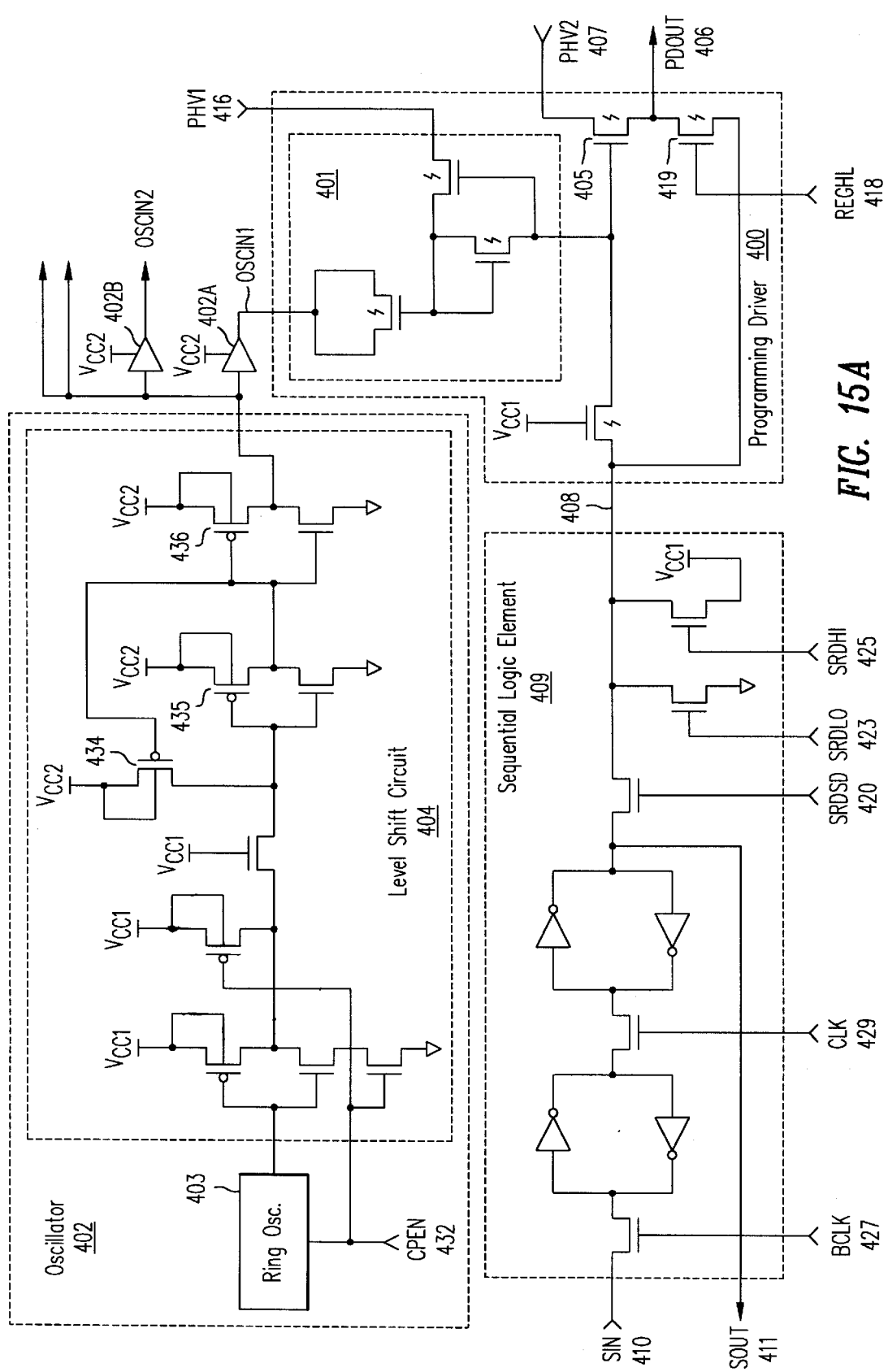

FIG. 15, comprising FIGS. 15A and 15B is a simplified circuit diagram in accordance with other embodiments wherein a programmable device (see programmable integrated circuit 101 of FIG. 9) has a first power input terminal (see power input terminal 106 of FIG. 9) for receiving a first supply voltage (for example, 3.3 volts) as well as a second power input terminal (see power input terminal 107 of FIG. 9) for receiving a second supply (for example, 5.0 volts). The first power input terminal receives the first supply voltage that powers the digital logic elements of the logic modules (see logic modules 110 of FIG. 9) of the programmable device during normal circuit operation (after antifuse programming). The second power input terminal is a high voltage compatible power input terminal that receives the second supply voltage during normal circuit operation and allows the programmable device to receive high voltage signals (greater than the first supply voltage) on its output terminals (see output terminals 105) from off-chip circuitry without damaging the programmable device. During antifuse programming, the second power input terminal is used to drive numerous charge pumps in the many programming drivers and programming control drivers of the programming control circuits (see programming control circuits 103 of FIG. 9). Using the second power input terminal to drive the charge pumps allows the charge pumps to be driven with a higher amplitude oscillating drive signal. The second power input terminal is electrically isolated from the first power input terminal in the sense that during antifuse programming there is a high impedance between the first and second power input terminals, there is no current flow from the first power input terminal to the second power input terminal, and there is no current flow from the second power input terminal to the first power input terminal. Rather than switching between ground potential and the first supply voltage (for example, 3.3 volts), the oscillating signal switches between ground potential and the second supply voltage (for example, 5.0 volts). Use of such a higher amplitude oscillating drive signal promotes starting of the charge pumps and/or improves charge pump efficiency.

FIG. 15 includes a circuit diagram of a programming driver 400. A charge pump 401 of the programming driver 400 receives a first oscillating signal from an oscillator 402 via a buffer 402A. Oscillator 402 includes a ring oscillator 403 and a level shift circuit 404. Ring oscillator 403 generates a second oscillating signal that switches between ground potential and the first supply voltage VCC1. The first supply voltage VCC1 may, for example, be 3.3 volts received on terminal 106 of FIG. 9. Level shift circuit 404 receives this second oscillating signal from ring oscillator 403 and generates from it the first oscillating signal. Rather than switching between ground potential and the first supply voltage VCC1, the first oscillating signal switches between ground potential and the second supply voltage VCC2. The second supply voltage VCC2 may, for example, be 5.0 volts received on terminal 107 of FIG. 9. This second oscillating signal is then buffered by buffer 402A and is supplied to charge pump 401.

It is generally desired to program the antifuses of the programmable device with a large programming current. The programming drivers (such as programming driver 400) should therefore be able to output the full programming voltage Vpp rather than the programming voltage Vpp less one transistor threshold voltage drop. A digital logic high signal on the gate electrode of output transistor 405 is therefore pumped higher so that there will not be a threshold voltage drop across transistor 405 when transistor 405 is on and programming driver 400 is outputting the programming voltage Vpp. PDOUT lead 406 is the output lead of programming driver 400. PHV2 lead 407 carries a programming voltage Vpp selected by a programming current multiplexer in accordance with a scheme set forth in U.S. patent application Ser. No. 08/667,702, filed Jun. 21, 1996, now U.S. Pat. No. 5,825,201, Oct. 20, 1998. (the subject matter of which is incorporated herein by reference).

Programming driver 400 receives a control signal on lead 408 from an associated sequential logic element 409. Although there is only one programming driver/sequential logic element pair shown in FIG. 15, it will be understood that a programming control circuit (for example, one of the programming control circuits 103 of FIG. 9) may include many such pairs, the serial input SIN and serial output SOUT leads 410 and 411 of the respective sequential logic elements being chained together to form a shift register.

A programming control circuit may also include programming control drivers that drive control signals onto programming control conductors to control programming transistors during antifuse programming. A programming control driver outputs ground potential if an associated programming transistor is to be off and outputs a pumped programming voltage if the associated programming transistor is to be on. The programming voltage is pumped higher to prevent a threshold voltage drop from being lost across the programming transistor that is to be on. The programming control driver 412 illustrated in FIG. 15 is controlled by an associated sequential logic element 413. Although there is only one programming control driver/sequential logic element pair shown in FIG. 15, it is understood that a programming control circuit typically includes many such pairs. In this embodiment, there is only one oscillator 402 on the programmable device, the first oscillating signal being buffered by numerous buffers and being supplied to the many charge pumps of the many programming drivers and programming control drivers on the chip. The first oscillating signal is supplied to the charge pump 414 of programming control driver 412 via another buffer 402B.

PHV1 leads 416 and 417 carry a programming voltage Vpp throughout the time antifuses are programmed in a programming mode. In one embodiment, PHV1 leads 416 and 417 are coupled to one programming voltage input terminal that is electrically isolated from other programming voltage input terminals so that PHV1 leads 416 and 417 carry the programming voltage Vpp when the voltages on the other programming voltage input terminals are at ground potential between consecutive programming voltage pulses.

REGHL lead 418 and pull-down transistor 419 are provided so the programming driver 400 can be controlled to output a "weak zero" during a test mode. Placing a digital logic high control signal on REGHL lead 418 causes transistor 419 to pull PDOUT output lead and its associated programming conductor (not shown) low. An output of a digital logic element of a selected logic module is then enabled to drive this programming conductor high and overpower the "weak zero". In a test, circuitry elsewhere on the chip determines whether the digital logic element successfully overpowered the "weak zero" by detecting the voltage on the programming conductor.

SRDSD leads 420 and 421 are output enable leads for sequential logic elements 409 and 413, respectively. If the outputs of the sequential logic elements 409 and 413 are not enabled, then the output leads 408 and 422 of the sequential logic elements 409 and 413 can be controlled to output either a low digital logic value by putting a high digital logic signal on SRDLO leads 423 and 424 or a high digital logic value by putting a high digital logic signal on SRDHI leads 425 and 426. BCLK and CLK leads 427-430 carry nonoverlapping clock signals that clock the sequential logic elements. PCDOUT lead 431 is the output lead of programming control driver 412. Oscillator 402 is disabled during normal circuit operation by a digital logic low signal on CPEN charge pump enable input lead 432. Resistor 433 is a polysilicon resistor.

In some embodiments, the supply voltage on the second power input terminal 107 during antifuse programming need not be the same as the supply voltage on the second power input terminal during normal circuit operation. The supply voltage on the second power input terminal during programming is preferably greater than the first supply voltage supplied to the digital logic elements of the logic modules during normal circuit operation but is smaller than the programming voltage. In some embodiments, the source-to-substrate breakdown voltage of P-channel pull-up transistors 434–436 in oscillator 402 and in buffers 402A and 402B is smaller than the programming voltage and the voltage on the second power input terminal during antifuse programming is smaller than this breakdown voltage but is larger than the supply voltage on the first power input terminal 106 during normal circuit operation.

The first power input terminal is coupled in one embodiment to supply the digital logic elements with a first supply voltage via a direct connection of the first power input terminal (bond pad) to the sources of P-channel pull-up transistors (not shown) of the digital logic elements in the logic modules. The second power input terminal is coupled in one embodiment to supply the oscillator with the second supply voltage via a direct connection of the second power input terminal (bond pad) to the sources of P-channel pull-up transistors 434–436 in oscillator 402.

Oscillator 403 can be other than a ring oscillator. The level shift circuit of FIG. 15 is illustrated only for exemplary purposes. Any suitable level shift circuit can be employed. Although oscillator 402 generates the second oscillating signal and then level shifts it up in voltage to generate the first oscillating signal, oscillator 402 can in other embodiments generate an oscillating signal that switches between ground and the second supply voltage thereby obviating the need for a level shift circuit. Power consumption is decreased in the embodiment of FIG. 15 by using a lower voltage (and therefore lower power) ring oscillator 403 and then increasing the amplitude of the oscillating signal output by the ring oscillator using a relatively low power level shift circuit 402.

Although the present invention is described in connection with certain specific embodiments for instructional purposes, the present invention is not limited thereto. The particular logic module input devices and output devices set forth above are merely illustrative. Although the invention is described above in connection with a three multiplexer and flip-flop type logic module, no particular type of logic module need be used. The logic modules of the logic array may abut each other and have no intervening routing channels, the interconnect structure being disposed above the logic modules in overlaying metal and antifuse layers. Although the specific embodiments are realized in CMOS circuitry, it is understood that other types of circuitry can be employed including BiCMOS circuitry. Although the illustrated process involves a P-type substrate with P-channel transistors disposed in N wells, other processes can be used including a twin-tub process where both P-channel and N-channel transistors are disposed in wells. In such a case, the semiconductor bodies of N-channel transistors in the logic array can be biased at a different potential from the semiconductor bodies of N-channel transistors in the programming control circuits and I/O cells. Other techniques for increasing transistor breakdown voltages can be employed including using different transistor structures and geometries, and using different gate insulator materials. Accordingly, various modifications, adaptations, and combinations of various features of the described embodiments can be practiced without departing from the scope of the invention as set forth in the claims.

What is claimed is:

1. A programmable device, comprising:
    a plurality of digital logic elements;
    a programmable interconnect structure comprising antifuses, the antifuses being programmable to connect selected ones of the digital logic elements together;
    a plurality of programming drivers, each of the programming drivers comprising a charge pump;
    a first power input terminal coupled to supply the digital logic elements with a first supply voltage on the first power input terminal during normal circuit operation;
    an oscillator outputting a first oscillating signal to the charge pumps of the programming drivers, the first oscillating signal switching between a ground potential and a second supply voltage during antifuse programming; and
    a second power input terminal coupled to supply the oscillator with the second supply voltage during antifuse programming, the second supply voltage being on the second power input terminal during antifuse programming, the second power input terminal being electrically isolated from the first power input terminal.

2. The programmable device of claim 1, further comprising:
    a plurality of programming control drivers, each of the programming control drivers comprising a charge pump, the oscillator outputting the first oscillating signal to the charge pumps of the programming control drivers.

3. The programmable device of claim 1, wherein the second supply voltage is greater than the first supply voltage during antifuse programming.

4. The programmable device of claim 1, wherein the oscillator comprises:
    a ring oscillator, the ring oscillator outputting a second oscillating signal, the second oscillating signal switching between a ground potential and the first supply voltage; and
    a level shift circuit, the level shift circuit receiving the second oscillating signal from the ring oscillator and outputting the first oscillating signal to the charge pumps of the programming drivers.

5. The programmable device of claim 1, further comprising:
    a plurality of sequential logic elements, each of the sequential logic elements having an output lead, each respective one of the programming drivers having an input lead that is coupled to an output lead of a respective one of the sequential logic elements.

6. The programmable device of claim 1, wherein the first power input terminal is a bonding pad, and wherein the second power input terminal is a bonding pad.

7. The programmable device of claim 1, wherein the oscillator does not output the first oscillating signal during normal circuit operation.

8. The programmable device of claim 1, wherein the digital logic elements output signals that switch between a ground potential and the first supply voltage during normal circuit operation.

9. A programmable device, comprising:
    a plurality of digital logic elements;
    a programmable interconnect structure comprising antifuses, the antifuses being programmable to connect selected ones of the digital logic elements together;
    a plurality of programming drivers, each of the programming drivers comprising a charge pump;
    means for supplying a first supply voltage from a first power input terminal to power the digital logic elements during normal circuit operation; and
    means for supplying a second supply voltage from a second power input terminal to power an oscillator circuit during antifuse programming such that an oscillating signal supplied to the charge pumps of the programming drivers has an amplitude of the second supply voltage, the first power input terminal being electrically isolated from the second power input terminal.

10. The programmable device of claim 9, further comprising:
    a plurality of output drivers coupled to output terminals of the programmable device, the second power input terminal being a high voltage compatibility terminal and being coupled to the output drivers.

11. A method, comprising:
    powering a plurality of digital logic elements during normal circuit operation of a programmable integrated circuit with a first supply voltage, the first supply voltage being received on a first power input terminal of the programmable integrated circuit;
    supplying an oscillating signal to a charge pump of a programming driver of the programmable integrated circuit during programming of antifuses of the programmable integrated circuit, the oscillating signal having an amplitude substantially equal to a second supply voltage received on a second power input terminal of the programmable integrated circuit, the second supply voltage being substantially greater than the first supply voltage, the antifuses being programmable to couple selected ones of the digital logic elements together; and
    coupling a third supply voltage received during normal circuit operation on the second power input terminal to output circuitry of the programmable integrated circuit so that a voltage greater than the first supply voltage can be driven onto a third terminal of the programmable integrated circuit by circuitry not on the programmable integrated circuit without damaging the output circuitry, the output circuitry being coupled to the third terminal.

12. The method of claim 11, wherein the second supply voltage is substantially equal to the third supply voltage.

13. The method of claim 11, wherein the first power input terminal, the second power input terminal and the third terminal are all bonding pads of the programmable integrated circuit.

14. The method of claim 11, wherein the oscillating signal has a cycle, the cycle having a voltage minimum and a voltage maximum, the amplitude being the difference between the voltage minimum and the voltage maximum.

* * * * *